US010498079B2

(12) United States Patent
Arimai et al.

(10) Patent No.: US 10,498,079 B2
(45) Date of Patent: Dec. 3, 2019

(54) ELECTRONIC DEVICE UNIT

(71) Applicants: Mitsubishi Electric Corporation, Tokyo (JP); NIPPON TANSHI CO., LTD., Kanagawa (JP)

(72) Inventors: Fumiaki Arimai, Tokyo (JP); Hiroyoshi Nishizaki, Tokyo (JP); Shinya Enomoto, Kanagawa (JP); Osamu Nishimura, Kanagawa (JP); Masaru Fujino, Kanagawa (JP)

(73) Assignees: Mitsubishi Electric Corporation, Chiyoda-ku, Tokyo (JP); NIPPON TANSHI CO., LTD., Hiratsuka-shi, Kanagawa (JP)

( * ) Notice: Subject to any disclaimer, the term of this patent is extended or adjusted under 35 U.S.C. 154(b) by 0 days.

(21) Appl. No.: 16/206,107

(22) Filed: Nov. 30, 2018

(65) Prior Publication Data

US 2019/0334284 A1 Oct. 31, 2019

(30) Foreign Application Priority Data

Apr. 25, 2018 (JP) ................................ 2018-083615

(51) Int. Cl.
*H01R 13/631* (2006.01)
*H05K 1/11* (2006.01)

(52) U.S. Cl.
CPC ........... *H01R 13/631* (2013.01); *H05K 1/117* (2013.01); *H05K 2201/2027* (2013.01)

(58) Field of Classification Search
CPC ................. H01R 13/631; H05H 1/117; H05K 2201/2027

(Continued)

(56) References Cited

U.S. PATENT DOCUMENTS 3,399,372 A 8/1968 Uberbacher
5,909,915 A * 6/1999 Okuda .................. H05K 3/284 174/521

(Continued)

FOREIGN PATENT DOCUMENTS

JP 61-92080 U 4/1986
JP 62-142869 U 9/1987

(Continued)

OTHER PUBLICATIONS

Japanese Office Action for Application No. 2018-083615 dated Oct. 30, 2018.

(Continued)

*Primary Examiner* — Harshad C Patel
(74) *Attorney, Agent, or Firm* — Sughrue Mion, PLLC; Richard C. Turner

(57) ABSTRACT

An electronic device unit includes a circuit board having: a sealing resin portion in which a region in which an electronic component is mounted is sealed by a sealing resin; and a board end portion exposed from a side of the sealing resin portion. A plurality of connection terminals are provided on the board end portion so as to be aligned in a direction of the side of the sealing resin portion, and a resin portion thicker than the board end portion and having a wall-like projection shape is provided at at least one of side surfaces of the board end portion in the direction of the side. The resin portion is integrally molded with the sealing resin portion of the circuit board and a side surface of the resin portion is press-fitted into an insertion chamber of a connector.

8 Claims, 10 Drawing Sheets

16 10 A A' B B' C C' D D' 17 17a 12a 13 19 17b 12 13 17c 18 17d

(58) Field of Classification Search
USPC .......................................................... 439/59
See application file for complete search history.

(56) References Cited

U.S. PATENT DOCUMENTS

| | | | | |
|---|---|---|---|---|
| 8,717,766 | B2 * | 5/2014 | Arimai .................. | H05K 3/284<br>257/706 |
| 2004/0192116 | A1 | 9/2004 | Matsuo et al. | |
| 2006/0012034 | A1 * | 1/2006 | Kadoya ................ | H05K 1/0203<br>257/712 |
| 2006/0134937 | A1 * | 6/2006 | Mayuzumi ............. | H05K 5/065<br>439/61 |
| 2006/0211309 | A1 | 9/2006 | Matsuo et al. | |
| 2013/0070426 | A1 | 3/2013 | Lippok et al. | |
| 2015/0349461 | A1 | 12/2015 | Arimai et al. | |
| 2015/0382470 | A1 | 12/2015 | Kuboki et al. | |
| 2016/0261059 | A1 | 9/2016 | Kanzaki et al. | |

FOREIGN PATENT DOCUMENTS

| | | | |
|---|---|---|---|
| JP | 63034997 | A | 2/1988 |
| JP | 2002321247 | A | 11/2002 |
| JP | 2004-296769 | A | 10/2004 |
| JP | 2013522890 | A | 6/2013 |
| JP | 5897065 | B2 | 3/2016 |
| JP | 6016965 | B2 | 10/2016 |
| WO | 2014/122867 | A1 | 8/2014 |

OTHER PUBLICATIONS

Japanese Extended Office Action dated Apr. 23, 2019 in Patent Application No. 2018-083615.

* cited by examiner

ELECTRONIC DEVICE UNIT

BACKGROUND OF THE INVENTION

1. Field of the Invention

The present disclosure relates to an electronic device unit having connection terminals which are to be connected to an external device.

2. Description of the Background Art

An electronic control device has been known in which a connector for external connection is provided at an end portion of a circuit board having electronic components mounted thereon and these elements are integrally molded by a sealing resin.

For example, Patent Document 1 discloses an electronic device unit that does not need a connector component for external connection at a circuit board side and is configured such that no resin leakage occurs at a conductive contact surface even when molding pressure is increased.

Patent Document 1: Japanese Patent No. 6016965 (see page 7, lines 13 to 31, and FIGS. 1 to 5)

Patent Document 2: Japanese Patent No. 5897065 (see page 13, lines 30 to 40, and FIGS. 2A and 4A)

According to Patent Document 1, in a multi-layer circuit board having a cut portion in a card edge terminal region, a side-surface outline portion and an end-face outline portion of the multi-layer circuit board, and an intermediate outline portion which is the inner peripheral surface of the cut portion, are connected by a sealing resin, and thus the end surface of the multi-layer circuit board is covered with the sealing resin along the entire circumference. When the multi-layer circuit board is inserted into a connector having an intermediate fitting portion, the positions in the right-left direction of the connector and the multi-layer circuit board are restricted by fitting the intermediate fitting portion into the intermediate outline portion of the multi-layer circuit board, so that contact terminals of the connector are brought into contact with copper foil pattern terminals of the multi-layer circuit board at an intermediate position. In addition, in the case where the number of copper foil pattern terminals is small, and the width of the multi-layer circuit board is small, side fitting portions provided at both sides of the connector and side-surface outline portions provided at both sides of the multi-layer circuit board are fitted to each other, whereby the positions in the right-left direction of the connector and the multi-layer circuit board are restricted. However, when a dimensional difference is created, by temperature change, due to a difference in coefficient of linear expansion between the multi-layer circuit board and the connector, the position restriction in the right-left direction does not function, and there is a concern that contact between the contact terminals and the copper foil pattern terminals may deviate from the intermediate position.

Moreover, in Patent Document 2, variation in the outer dimension of a card edge terminal portion is reduced by integrally molding a side-surface coating resin and an end-surface coating resin with an outer resin member.

However, when disturbance such as temperature change or vibration is applied to a connector, looseness may occur due to variation in the outer dimension of the card edge terminal portion or due to a clearance for fitting that takes the variation into consideration, and contact point portions of card edge terminals and terminals of the connector may deteriorate due to slight sliding abrasion. Therefore, inhibition of occurrence of slight sliding abrasion is required for further increasing reliability.

SUMMARY OF THE INVENTION

The present disclosure discloses a technique for solving the above problems, and an object of the present disclosure is to provide a highly reliable electronic device unit in which relative positions of terminals of a circuit board and terminals of a connector do not change at contact portions thereof and slight sliding abrasion does not occur even when temperature change or vibration is applied to the connector.

An electronic device unit disclosed in the present disclosure is an electronic device unit including: a circuit board having a sealing resin portion in which a region in which an electronic component is mounted is sealed by a resin, and a board end portion exposed from one side of the sealing resin portion; and a plurality of connection terminals provided on the board end portion and aligned in a direction of the side of the sealing resin portion, the plurality of connection terminals being connected to terminals of a connector when the board end portion is inserted into the connector, wherein a resin portion thicker than the board end portion is provided at at least one of side surfaces of the board end portion in the direction in which the plurality of connection terminals are aligned, and a side surface of the resin portion is press-fitted into an insertion chamber of the connector.

According to this configuration, since the resin portion thicker than the board end portion is provided at the side surface of the board end portion on which the plurality of connection terminals are arranged and the side surface of the resin portion is press-fitted into the insertion chamber of the connector, the relative positions of the connection terminals of the board end portion and the terminals of the connector are fixed in the direction in which the plurality of connection terminals are aligned. Thus, it is possible to provide a highly reliable electronic device unit in which positional displacement due to vibration and dimensional change caused by temperature change is inhibited and slight sliding abrasion does not occur.

DETAILED DESCRIPTION OF THE PREFERRED EMBODIMENTS OF THE INVENTION

Figure 1:
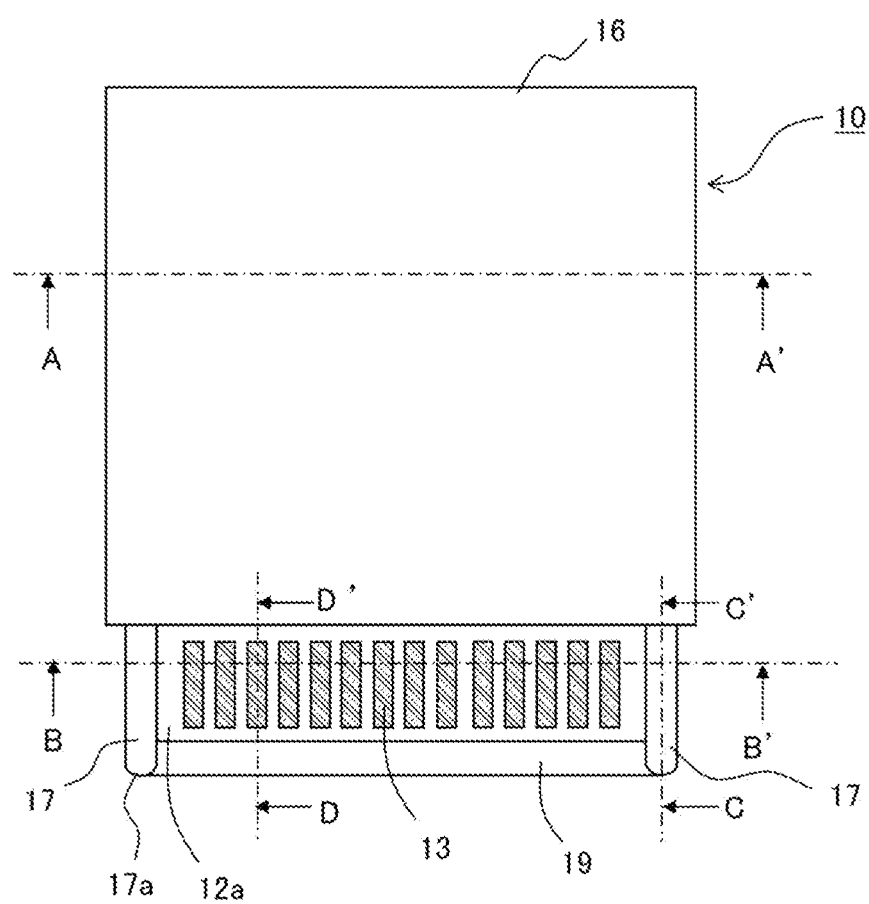
FIG. 1 is a plan view showing an electronic device unit according to a first embodiment.

Hereinafter, embodiments will be described with reference to the drawings. In the respective drawings, the same reference characters denote the same or corresponding parts.

First Embodiment

An electronic device unit according to a first embodiment will be described using a card edge terminal type electronic device unit as an example with reference to FIGS. 1 to 7.

Figure 2:
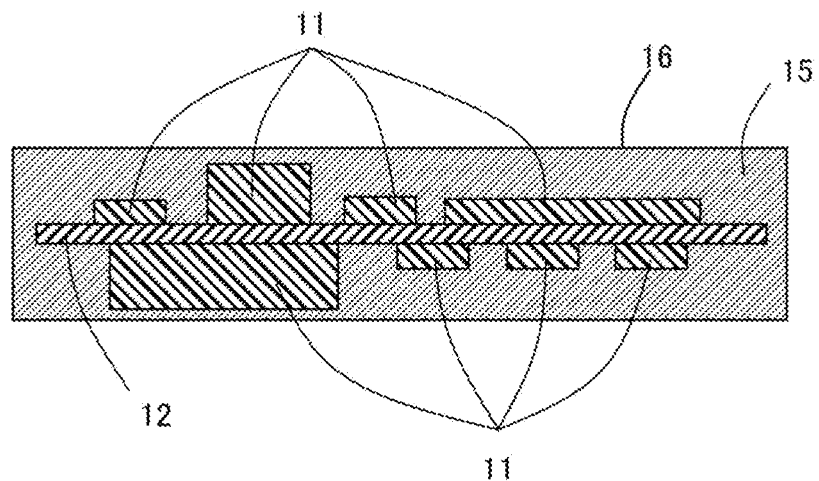
FIG. 2 is a cross-sectional view taken along a line A-A' in FIG. 1 as seen in an arrow direction.

FIG. 1 is a plan view showing the electronic device unit according to the first embodiment, and FIG. 2 is a cross-sectional view taken along a line A-A' in FIG. 1 as seen from an arrow direction. In the electronic device unit 10, electronic components 11 are mounted on a circuit board 12. The electronic device unit 10 includes a sealing resin portion 16 integrally molded with a sealing resin 15, and a plurality of connection terminals 13 which are provided on a board end portion 12*a*, of the circuit board 12, exposed from one side of the sealing resin portion 16 and are aligned in the direction of the side. The connection terminals 13 are connected to an external device via a later-described female connector 31.

Figure 3:
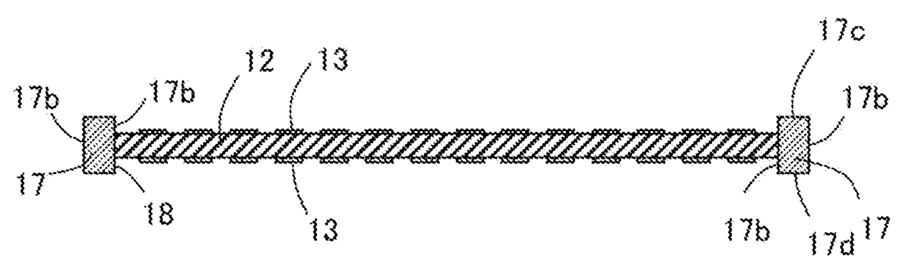
FIG. 3 is a cross-sectional view taken along a line B-B' in FIG. 1 as seen in an arrow direction.

FIG. 3 is a cross-sectional view taken along a line B-B' in FIG. 1 as seen in an arrow direction. For example, the connection terminals 13 have a copper foil pattern and are formed on both surfaces of the board end portion 12*a*. In addition, resin portions 17 having wall-like projection shapes are provided at side surfaces of the board end portion 12*a* in the direction in which the connection terminals 13 are aligned along the side of the sealing resin portion 16, that is, along a side of the circuit board 12. Each of the resin portions 17 having wall-like projection shapes is formed so as to be thicker than the board end portion 12*a* and extend outward of the surfaces of the connection terminals 13, which are formed on both surfaces of the board end portion 12*a*, in order to protect the connection terminals 13.

Figure 4A:
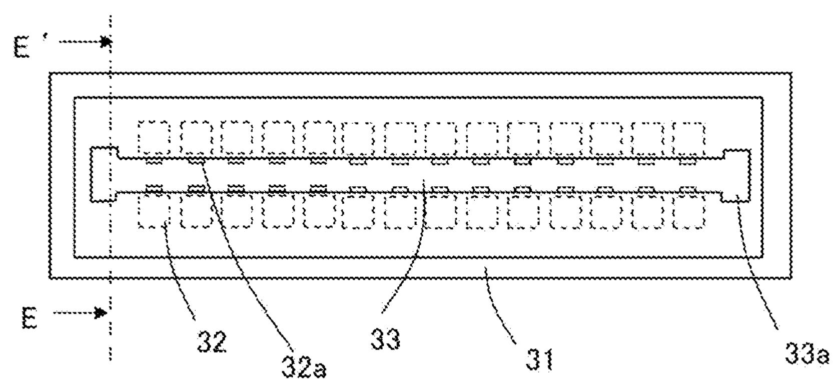
FIG. 4A is a plan view of a female connector which is to be connected to the electronic device unit according to the first embodiment, showing an insertion port of the female connector.
Figure 4B:
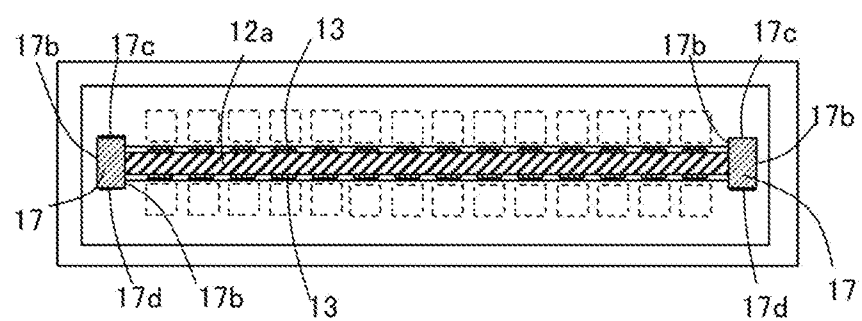
FIG. 4B is a diagram of the female connector which is to be connected to the electronic device unit according to the first embodiment, showing a state where a board end portion is inserted into the female connector.

FIG. 4A is a plan view showing an insertion port of the female connector 31 which is to be connected to the electronic device unit 10 according to the first embodiment, and FIG. 4B is a diagram showing a state where the board end portion 12*a* is inserted into the female connector 31. In FIGS. 4A and 4B, the female connector 31 has an insertion chamber 33 into which the connection terminals 13 of the electronic device unit 10 are to be inserted, and the resin portions 17, which are provided at the side surfaces of the board end portion 12*a* of the circuit board 12, are press-fitted into end portions 33*a* of the insertion chamber 33. Female terminals 32 are provided at the upper surface and the lower surface of the insertion chamber 33 so as to correspond to the connection terminals 13 of the electronic device unit 10. The connection terminals 13 of the electronic device unit 10 are inserted, and the electronic device unit 10 is fitted to the female connector 31.

The female connector 31 is detachably attached to the board end portion 12*a* of the circuit board 12.

Figure 5:
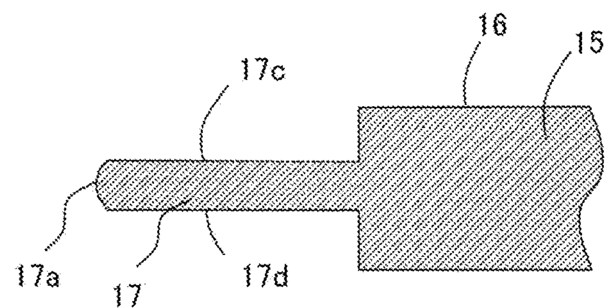
FIG. 5 is a cross-sectional view taken along a line C-C' in FIG. 1 as seen in an arrow direction.
Figure 6:
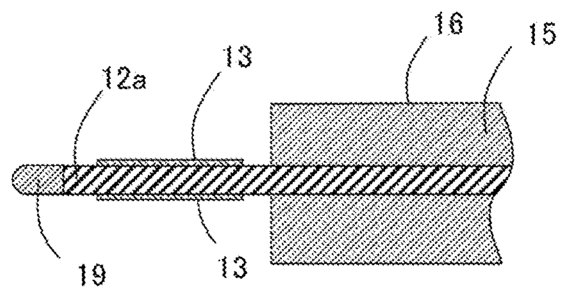
FIG. 6 is a cross-sectional view taken along a line D-D' in FIG. 1 as seen in an arrow direction.

FIG. 5 is a cross-sectional view taken along a line C-C' in FIG. 1 as seen in an arrow direction, and FIG. 6 is a cross-sectional view taken along a line D-D' in FIG. 1 as seen in an arrow direction.

Each resin portion 17 having a wall-like projection shape can be simultaneously molded when the sealing resin portion 16 is formed by integrally molding the electronic components 11 and the circuit board 12 with the sealing resin 15. Each of distal end portions 17*a* of the resin portions 17 which are to be initially inserted into the insertion chamber 33 of the female connector 31 has a smooth inclined cross-sectional shape taken along a plane parallel to the terminal surfaces of the connection terminals 13 (see FIG. 1). In addition, as shown in FIG. 5, each distal end portion 17*a* also has a smooth inclined cross-sectional shape taken along a plane perpendicular to the direction in which the connection terminals 13 are aligned. The smooth inclined shape is, for example, a part of a spherical surface having an arc cross-section as shown.

Since the above resin portions 17 are provided, even when the relative positions of the electronic device unit 10 and the female connector 31 are displaced, due to a clearance for fitting, in the direction in which the connection terminals 13 are aligned and in a direction perpendicular to the terminal surfaces of the connection terminals 13, the distal end portions 17*a* of the resin portions 17 can be smoothly inserted into the end portions 33*a* of the insertion chamber 33 of the female connector 31 in a sliding manner, whereby the positional displacement of the electronic device unit 10 and the female connector 31 can be corrected.

In the board end portion 12*a* exposed from the sealing resin portion 16, a board end portion at which no resin portion 17 is provided is a board end portion which is to be initially inserted into the insertion chamber 33 of the female connector 31. A board end resin portion 19 formed from the same material as the resin portions 17 is provided at the board end portion. The board end resin portion 19 has a smooth inclined cross-sectional shape taken along a plane perpendicular to the direction in which the connection terminals 13 are aligned, and has an arc-shaped cross-section as shown in FIG. 6, for example.

The above board end resin portion 19 can also be molded by integrally molding the electronic components 11 and the circuit board 12 by the sealing resin 15. In a step of forming the sealing resin portion 16, the sealing resin portion 16 is simultaneously molded together with the resin portions 17, and thus a manufacturing step of preparing another member and assembling another member becomes unnecessary. Therefore, the board end resin portion 19 and the resin portions 17 can be provided without additional cost. In addition, for variation in the outer shape of the circuit board 12, variation in the shape of a card edge terminal region can be reduced by integrally molding the board end resin portion 19 and the resin portions 17 by the sealing resin 15. Accordingly, the accuracy of the positions of the end portions 33*a* of the insertion chamber 33 of the female connector 31 and the resin portions 17 can be increased, and the resin portions 17 can be more smoothly press-fitted.

Figure 7:
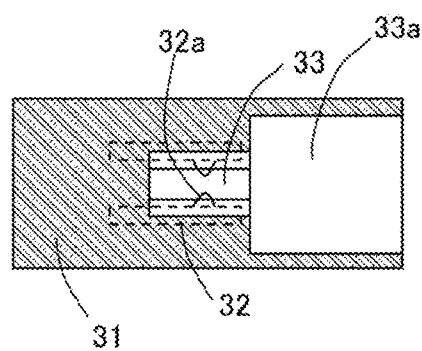
FIG. 7 is a cross-sectional view taken along a line E-E' in FIG. 4A as seen in an arrow direction.

FIG. 7 is a cross-sectional view taken along a line E-E' in FIG. 4A as seen in an arrow direction. When the electronic device unit 10 and the female connector 31 are fitted, contact points 32*a* of terminals 32 arranged in the female connector 31 can be smoothly brought into contact with the board end resin portion 19 in a sliding manner.

The connection terminals 13 are plated with gold for preventing oxidation of the copper foil pattern surfaces of the terminals 13. In order to plate the connection terminals 13 with gold by electrolytic plating during production of the circuit board 12, an electrolytic plating wire connected to the copper foil pattern of the connection terminals 13 need to be extended to a disposable board portion for production provided outside the circuit board 12. The electrolytic plating wire is removed by press-cutting or router cutting in a manufacturing step of forming the outer shape of the circuit board 12, but an end surface of the electrolytic plating wire remains in the end surface of the circuit board 12. Thus, there is a concern that corrosion may occur from the end-surface portion of the wire and the electrolytic plating wire is separated or the corrosion may proceed to the connection terminal 13. By molding the board end resin portion 19 at the end-surface portion of the circuit board 12, the end portion of the electrolytic plating wire can be protected, so that corrosion can be prevented.

When the ambient temperature of the electronic device unit 10 and the female connector 31 has changed, the circuit board 12 and the female connector 31 expand or contract due to the coefficients of linear expansion based on the materials thereof. When there has been a difference in expansion or contraction between the circuit board 12 and the female connector 31, positional displacement occurs between the connection terminals 13 and the contact points 32*a* of the terminals 32 arranged in the female connector 31. When a change in the ambient temperature repeatedly occurs, positional displacement repeatedly occurs between the connection terminals 13 and the contact points 32*a* of the terminals 32, and the plating that protects the surfaces of the connection terminals 13 and the contact points 32*a* of the terminals 32 from oxidation and the like becomes abraded due to slight sliding abrasion caused by the positional displacement, so that the value of contact resistance between the connection terminals 13 and the terminals 32 increases. Furthermore, the abrasion powder generated by the abrasion may change into an insulating material due to oxidation, and thus may lead to poor electrical conduction between the connection terminals 13 and the terminals 32.

Therefore, in the card edge terminal type electronic device unit 10 described in the present embodiment, materials are selected such that the coefficients of linear expansion of the circuit board 12 and the female connector 31 are equal to each other. However, it is difficult to make the coefficient of linear expansion of the circuit board 12, for which a thermosetting resin is generally used, equal to that of the female connector 31, for which a thermoplastic resin is generally used. Thus, by press-fitting side surfaces 17*b* of the resin portions 17 into the insertion chamber 33, the female connector 31 and the board end portion 12*a* which is the card edge terminal region are integrated with each other, whereby the connection terminals 13 and the contact points 32*a* of the terminals 32 are inhibited from being positionally displaced due to expansion or contraction accompanying temperature change.

The resin portions 17 are desirably provided at both sides of the board end portion 12*a*. However, in the case with a small number of poles, for example, in the case where the total number of connection terminals 13 is equal to or less than 10, positional displacement due to expansion or contraction accompanying temperature change is small. Thus, even when the resin portion 17 is provided only at one side of the board end portion 12*a* and the female connector 31 and the board end portion 12*a*, which is the card edge terminal region, are integrated with each other, occurrence of slight sliding abrasion can be inhibited.

The causes for the slight sliding abrasion include not only temperature change but also vibration. Since the side surfaces 17*b* of the resin portions 17 are press-fitted into the insertion chamber 33, there is no looseness in the direction in which the connection terminals 13 are laterally aligned, and even when vibration occurs, the connection terminals 13 and the contact points 32*a* of the terminals 32 are inhibited from being positionally displaced. Furthermore, upper surfaces 17*c* and lower surfaces 17*d* of the resin portions 17 are also press-fitted into the insertion chamber 33. Thus, there is no looseness in the direction perpendicular to the terminal surfaces of the connection terminals 13, and positional displacement of contact points 32*a* and change in contact pressure accompanying change in the distance between the circuit board 12 and the terminals 32 are inhibited.

As described above, according to the configuration of the first embodiment, even when the ambient temperature has changed, the positions where the contact points 32*a* of the terminals 32 of the female connector 31 and the connection terminals 13, which are provided on the board end portion 12*a* of the electronic device unit 10, are in contact with each other do not change. In addition, even when vibration or the like has occurred, the relative positional relationship between the contact points 32*a* of the terminals 32 of the female connector 31 and the connection terminals 13, which are provided on the board end portion 12*a* of the electronic device unit 10, does not change. Therefore, it is possible to provide a highly reliable electronic device unit in which no slight sliding abrasion occurs at a contact point portion of each terminal.

Second Embodiment

An electronic device unit according to a second embodiment is an example in which a cutout region is provided at and around the center of a board end portion 12*a* in a card edge terminal type electronic device unit.

Figure 8:
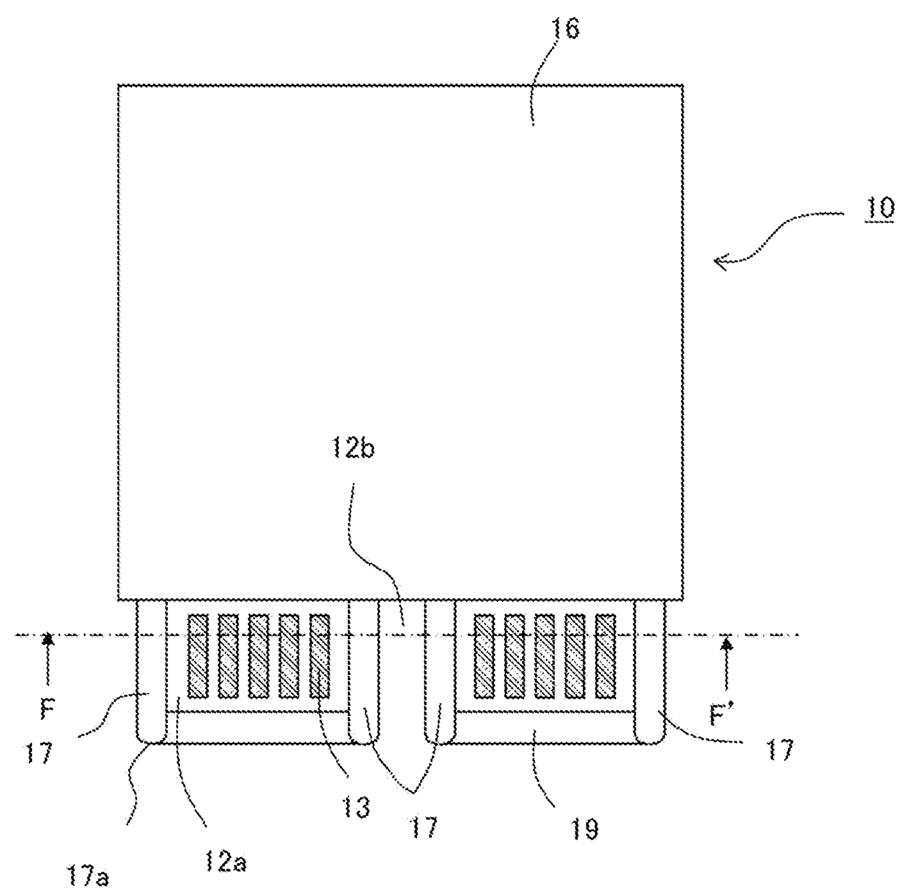
FIG. 8 is a plan view showing an electronic device unit according to a second embodiment.

FIG. 8 is a plan view showing the electronic device unit according to the second embodiment. In FIG. 8, in the electronic device unit 10, similar to the first embodiment, electronic components 11 are mounted on a circuit board 12, and the electronic device unit 10 includes: a sealing resin portion 16 integrally molded with a sealing resin 15; and connection terminals 13 which are formed on a board end portion 12*a* obtained by exposing the circuit board 12 from the sealing resin portion 16 and are to be connected to an external device via a female connector 31. Resin portions 17 having wall-like projection shapes are provided at both outer side surfaces of the board end portion 12*a* in the direction in which the connection terminals 13 are aligned along the sealing resin portion 16. Each of the resin portions 17 having wall-like projection shapes is formed so as to be thicker than the board end portion 12*a* and extend outward of the surfaces of the connection terminals 13, which are formed on both surfaces of the board end portion 12*a*, in order to protect the connection terminals 13. Unlike the first embodiment, a cutout region 12*b* is provided at a center portion of the board end portion 12*a*, and resin portions 17 having wall-like projection shapes are also formed at side surfaces of the board end portion 12*a* at the center side at which the cutout region 12*b* is provided.

Figure 9:
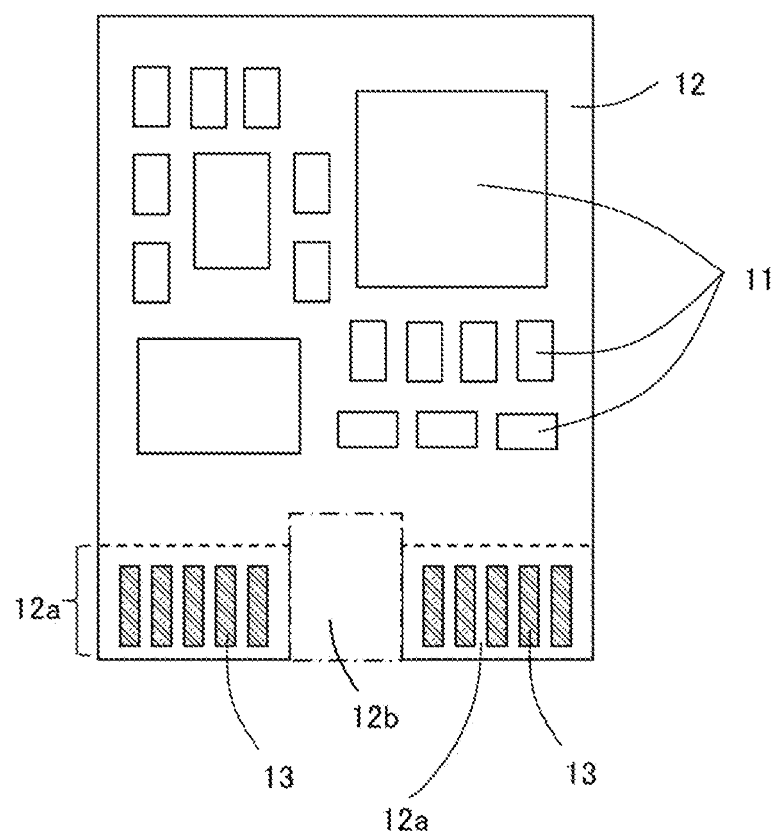
FIG. 9 is a plan view of a circuit board of the electronic device unit according to the second embodiment.

FIG. 9 is a plan view of the circuit board 12 of the electronic device unit 10 in FIG. 8. The circuit board 12 has a region in which electronic components are mounted and which is the sealing resin portion 16, and the board end portion 12*a* exposed from the sealing resin portion 16. A region that is located at the center portion of the board end portion 12*a* and shown by an alternate long and short dash line is the cutout region 12*b*. When the sealing resin portion 16 is formed by integrally molding the electronic components 11 and the circuit board 12 by the sealing resin 15, the sealing resin portion 16 can be simultaneously molded together with the multiple resin portions 17 having wall-like projection shapes and a board end resin portion 19 at the distal end of the board end portion 12*a* shown in FIG. 8.

Figure 10:
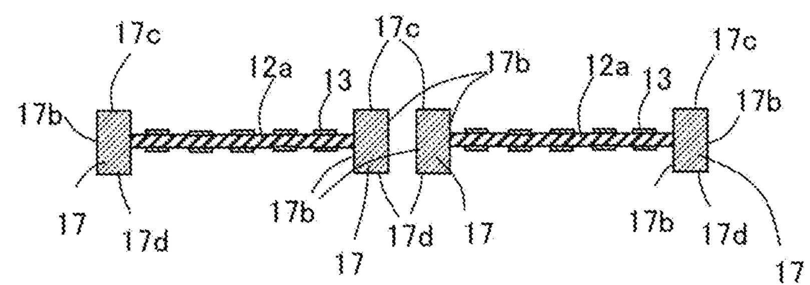
FIG. 10 is a cross-sectional view taken along a line F-F' in FIG. 8 as seen from an arrow direction.

FIG. 10 is a cross-sectional view taken along a line F-F' in FIG. 8 as seen in an arrow direction, showing a state where the resin portions 17 are also formed at the side surfaces at the cutout region 12*b* side. As described above, due to the simultaneous molding, a manufacturing step of preparing another member and assembling another member becomes unnecessary. Therefore, in the second embodiment as well, the board end resin portion 19 and the resin portions 17 can be provided without additional cost.

Figure 11:
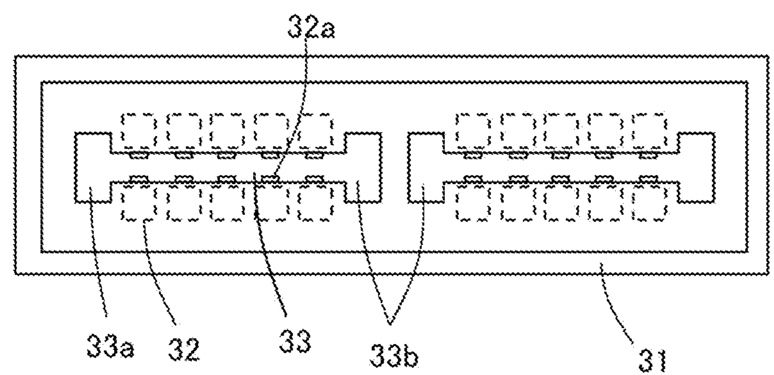
FIG. 11 is a plan view showing a female connector which is to be connected to the electronic device unit according to the second embodiment.

FIG. 11 is a plan view showing an insertion port of the female connector 31 which is to be connected to the electronic device unit 10 according to the second embodiment. In FIG. 11, the female connector 31 includes insertion chambers 33 into which the connection terminals 13 of the electronic device unit 10 are to be inserted. The resin portions 17 provided at the side surfaces of the board end portion 12*a* of the circuit board 12 and the resin portions 17 provided at the end portions at the central cutout region 12*b* side as shown in FIG. 10 are press-fitted into end portions 33*a* of the insertion chambers 33 and end portions 33*b* of the insertion chambers 33 at the center portion of the female connector 31, respectively. Terminals 32 and contact points 32*a* are provided at the upper surfaces and the lower surfaces of the insertion chambers 33 so as to correspond to the connection terminals 13 of the electronic device unit 10. The connection terminals 13 of the electronic device unit 10 are inserted, and the electronic device unit 10 is fitted to the female connector 31.

In the second embodiment, the distance between the resin portions 17 can be shortened as compared to that in the case where the resin portions 17 are provided at both ends of the board end portion 12*a*, which is the card edge terminal region, as in the first embodiment. When the distance between the resin portions 17 is shortened, the connection terminals 13 and the contact points 32*a* of the terminals 32 can be more reliably inhibited from being positionally displaced due to expansion or contraction accompanying temperature change. In addition, positional displacement of the contact points 32*a* due to vibration can also be more reliably inhibited, so that it is possible to further increase the reliability.

As described above, the resin portions 17 are desirably provided at both the outer side surfaces of the board end portion 12*a* and the side surfaces at the cutout region 12*b* side of the board end portion 12*a*. However, in the case with a small number of poles, for example, in the case where the board end portion 12*a* is divided and the total number of connection terminals 13 is equal to or less than 10 as in the second embodiment, positional displacement due to expansion or contraction accompanying temperature change is small. Thus, even when the resin portions 17 are provided at only either the outer side surfaces of the board end portion 12*a* or the side surfaces at the cutout region 12*b* side of the board end portion 12*a* and the female connector 31 and the board end portion 12*a*, which is the card edge terminal region, are integrated with each other, occurrence of slight sliding abrasion can be inhibited.

As described above, according to the configuration of the second embodiment, the same advantageous effects as those of the first embodiment are achieved. Furthermore, in the case where the cutout region 12*b* is provided at and around the center of the board end portion 12*a* of the circuit board 12, the distance between the resin portions 17 can be shortened by providing the resin portions 17 at the side portions of the circuit board 12 that are in contact with the cutout region 12*b*. Accordingly, the connection terminals 13 and the contact points 32*a* of the terminals 32 can be more reliably inhibited from being positionally displaced due to expansion or contraction accompanying temperature change. In addition, positional displacement of the contact points 32*a* due to vibration can also be more reliably inhibited, so that it is possible to further increase the reliability.

The cross-section of each resin portion 17 in the direction of insertion into the connector has a rectangular shape (quadrangular shape) as in FIG. 3 of the first embodiment and FIG. 10 of the second embodiment, but may have a circular shape or an elliptical shape. When the end portions 33*a* and 33*b* of the insertion chambers 33 of the female connector 31 have a circular shape or an elliptical shape that is the same as the shape of the cross-section of each resin portion 17 and the resin portions 17 are press-fitted thereinto, the positions where the contact points 32*a* of the terminals 32 of the female connector 31 and the connection terminals 13, which are provided on the board end portion 12*a* of the electronic device unit 10, are in contact with each other do not change.

Figure 12C:
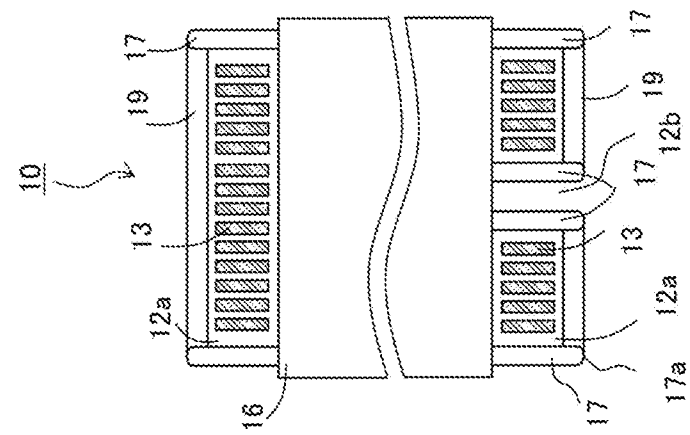
FIG. 12C is a plan view showing still another electronic device unit according to the first and second embodiments.
Figure 12B:
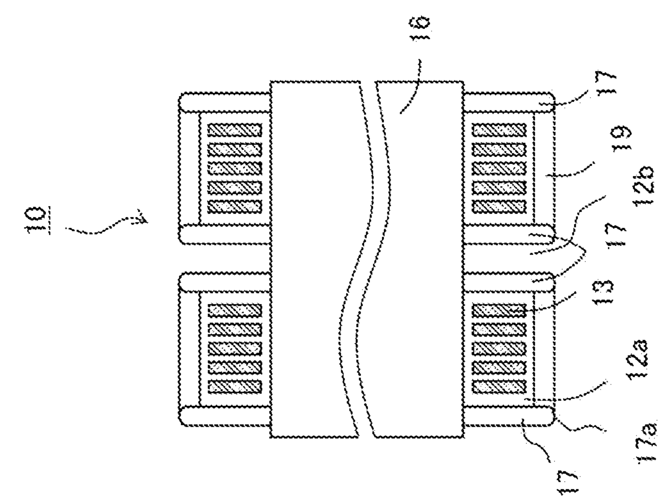
FIG. 12B is a plan view showing still another electronic device unit according to the first and second embodiments.
Figure 12A:
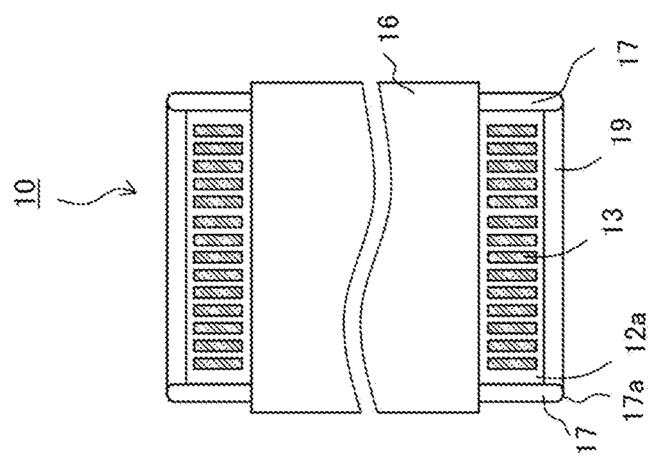
FIG. 12A is a plan view showing another electronic device unit according to the first and second embodiments.

In the first and second embodiments, the board end portion 12*a* of the circuit board 12 is exposed from one side of the sealing resin portion 16. However, the position of the board end portion 12*a* is not limited to the one side, and in the electronic device unit, the circuit board 12 may be exposed from opposing sides of the sealing resin portion 16, and the board end portion 12*a* may be provided at each of the opposing sides. FIGS. 12A to 12C are each a plan view showing an electronic device unit having board end portions at both sides. As shown in FIG. 12A, the board end portion 12*a* shown in the first embodiment may be provided at each side. As shown in FIG. 12B, the board end portion 12*a*, shown in the second embodiment, having the cutout region 12*b* at the center thereof may be provided at each side. As shown in FIG. 12C, the board end portion 12*a* shown in the first embodiment may be provided at one side, and the board end portion 12*a* having the cutout region 12*b* at the center thereof may be provided at the opposite side. In any of these electronic device units 10, a resin portion 17 having a wall-like projection shape and serving to protect the connection terminals 13 is provided at at least one of side surfaces of each board end portion 12*a* in the direction in which the connection terminals 13 are aligned, and the side surface 17*b* of the resin portion 17 is press-fitted into the insertion chamber 33 of the female connector 31, or a resin portion 17 having a wall-like projection shape is provided at each side surface that is in contact with the cutout region 12*b*, and the side surface 17*b* of the resin portion 17 is press-fitted into the insertion chamber 33 of the female connector 31. Thus, it is needless to say that the same advantageous effects as those of the first or second embodiment are achieved.

Figure 13A:
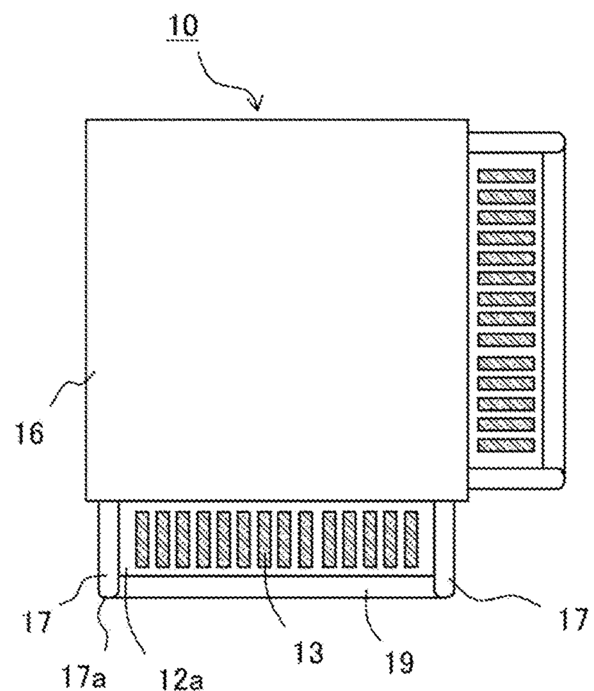
FIG. 13A is a plan view showing still another electronic device unit according to the first and second embodiments.
Figure 13B:
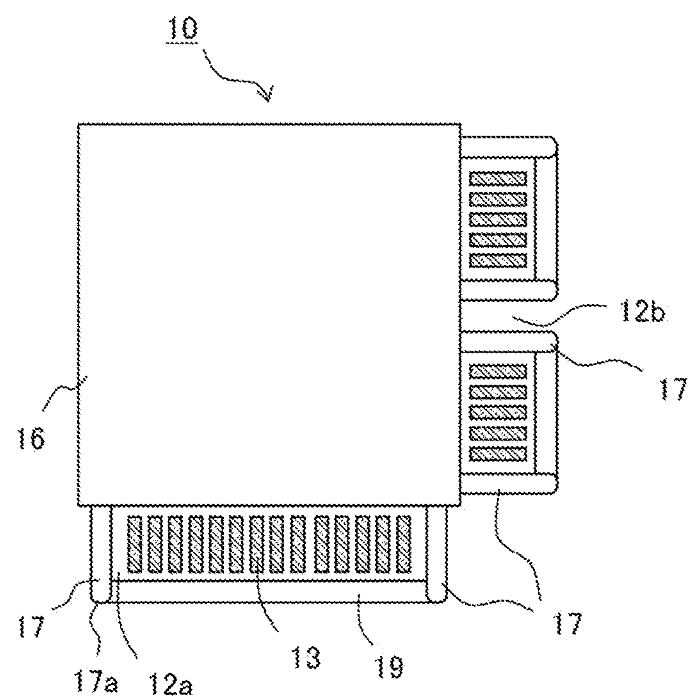
FIG. 13B is a plan view showing still another electronic device unit according to the first and second embodiments.

In addition, the electronic device unit 10 is not limited to an electronic device unit having one board end portion 12*a* obtained by exposing the circuit board 12 from one side of the sealing resin portion 16, and an electronic device unit having two board end portions 12*a* obtained by exposing the circuit board 12 from opposing sides of the sealing resin portion 16. FIGS. 13A and 13B are each a plan view of an electronic device unit 10 having two board end portions 12*a* exposed from adjacent sides of the sealing resin portion 16. As shown in FIG. 13A, the board end portions 12*a* shown in the first embodiment may be disposed adjacent to each other. Although not shown, the board end portions 12*a* shown in the second embodiment may be disposed adjacent to each other. In addition, as shown in FIG. 13B, the board end portion 12*a* shown in the first embodiment and the board end portion 12*a* shown in the second embodiment may be disposed adjacent to each other.

Furthermore, the electronic device unit 10 may have a plurality of board end portions 12*a* obtained by exposing the circuit board 12 from three or four sides of the sealing resin portion 16.

Figure 14A:
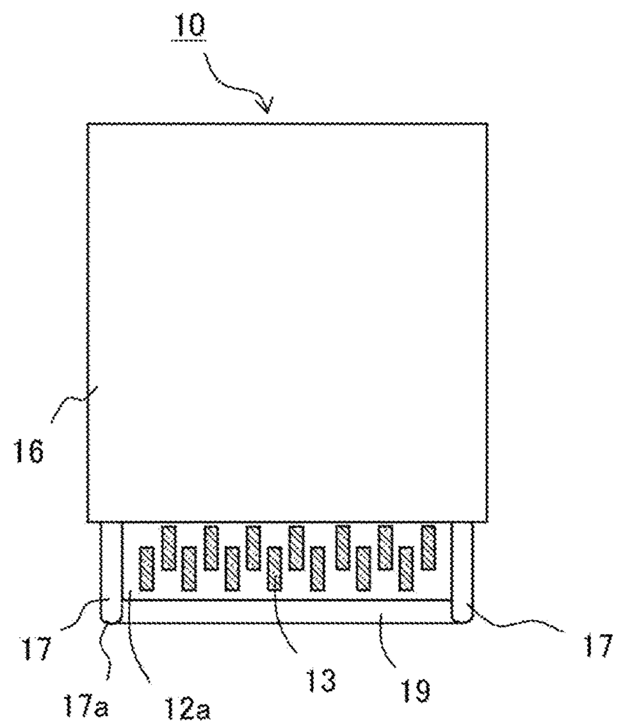
FIG. 14A is a plan view showing still another electronic device unit according to the first and second embodiments.
Figure 14B:
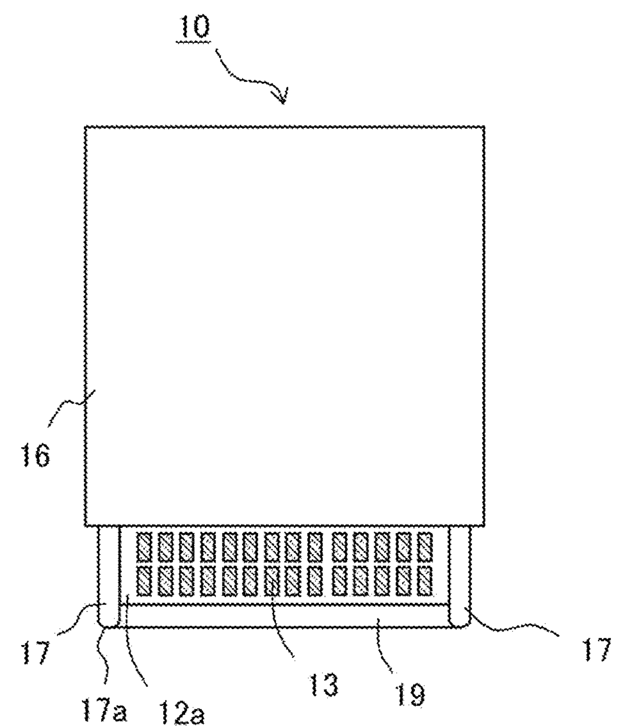
FIG. 14B is a plan view showing still another electronic device unit according to the first and second embodiments.

In the first and second embodiments, the multiple connection terminals 13 are provided which are aligned on the board end portion 12*a* of the circuit board 12 in a row in the direction of the side of the sealing resin portion 16 and have a copper foil pattern which is to be connected to the female terminals 32 arranged in the female connector 31. However, the connection terminals 13 are not limited to one row. FIGS. 14A and 14B are each a plan view of an electronic device unit 10 in which connection terminals 13 are formed so as to be aligned in a plurality of rows in the direction of the side of the sealing resin portion 16. FIG. 14A shows an example in which the connection terminals 13 are formed in a staggered arrangement in the direction of the side, and FIG. 14B shows an example in which the connection terminals 13 are formed in two rows in the direction of the side.

Even if the connection terminals 13 formed on the board end portion 12*a* becomes dense as in a plurality of rows, or the positions of contact points become complicated as in a staggered arrangement as described above, when the resin portions 17 are press-fitted, the relative positions of the connection terminals 13 on the board end portion and the terminals 32 of the connector 31 are fixed in the direction in which the connection terminals are aligned. Therefore, it is possible to provide a highly reliable electronic device unit.

The above first and second embodiments are summarized as follows.

The electronic device unit 10 according to the present disclosure is a card edge terminal type electronic device unit 10 including the circuit board 12 on which a plurality of the electronic components 11 are arranged, and a plurality of the connection terminals 13 which are laterally aligned on the board end portion 12*a* of the circuit board 12 and have a copper foil pattern which is to be connected to the female terminals 32 arranged in the female connector 31, wherein: the sealing resin portion 16 is formed by integrally molding a region of the circuit board 12 other than the board end portion 12*a* on which the connection terminals 13 are arranged and the electronic components 11 by the sealing resin 15; regarding the side surfaces of the board end portion 12*a* of the circuit board 12 exposed from the sealing resin portion 16, the resin portion 17 having a wall-like projection shape and serving to protect the connection terminals 13 is provided at at least one of the side surfaces of the board end portion 12*a* in the direction in which the connection terminals 13 are aligned; and the side surface 17*b* of the resin portion 17 is press-fitted into the insertion chamber 33 of the female connector 31.

According to this configuration, since the side surface 17*b* of the resin portion 17 provided at at least one of the side surfaces of the board end portion 12*a* in the direction in which the connection terminals 13 are aligned is press-fitted into the insertion chamber 33 of the female connector 31, the relative positions of the connection terminals 13 and the terminals 32 are fixed in the direction in which the connection terminals 13 are aligned. Therefore, positional displacement due to vibration and dimensional change caused by temperature change can be inhibited.

In the electronic device unit 10 according to the present disclosure, the resin portion 17 having a wall-like projection shape and the sealing resin portion 16 are preferably integrally molded by the sealing resin 15.

According to this configuration, when the sealing resin portion 16 is formed by integrally molding the electronic components 11 and the circuit board 12 by the sealing resin 15, the resin portion 17 can be simultaneously molded. Therefore, a manufacturing step of preparing another member and assembling another member becomes unnecessary. Accordingly, the resin portion 17 can be provided without additional cost.

In the electronic device unit 10 according to the present disclosure, the distal end portion of the resin portion 17 which is to be inserted into the insertion chamber 33 of the female connector 31 preferably has a smooth inclined cross-sectional shape taken along a plane parallel to the terminal surfaces of the connection terminals 13.

According to this configuration, even when the relative positions of the electronic device unit 10 and the female connector 31 are displaced, due to a clearance for fitting, in the direction in which the connection terminals 13 are aligned, the distal end portion of the resin portion 17 can be smoothly inserted into the insertion chamber 33 of the female connector 31 in a sliding manner, whereby the positional displacement of the electronic device unit 10 and the female connector 31 can be corrected.

In the electronic device unit 10 according to the present disclosure, preferably, the board end resin portion 19 formed from the same material as the resin portion 17 is provided at the side surface of the board end portion 12*a* of the circuit board 12 which is to be inserted into the insertion chamber 33 of the female connector 31, and has a smooth inclined cross-sectional shape taken along a plane perpendicular to the direction in which the connection terminals 13 are aligned.

According to this configuration, the resin portion 17 and the board end resin portion 19 can be simultaneously molded when the electronic components 11 and the circuit board 12 are integrally molded by the sealing resin 15, and the contact points 32*a* of the terminals 32 arranged in the female connector 31 can be smoothly brought into contact with the board end resin portion 19 in a sliding manner when the electronic device unit 10 and the female connector 31 are fitted.

In the electronic device unit 10 according to the present disclosure, the upper surface 17*c* and the lower surface 17*d* of the resin portion 17 are preferably press-fitted into the end portion 33*a* of the insertion chamber 33 of the female connector 31.

According to this configuration, since the upper surface 17*c* and the lower surface 17*d* of the resin portion 17 are press-fitted into the end portion 33*a* of the insertion chamber 33 of the female connector 31, the relative positions of the connection terminals 13 and the terminals 32 are fixed in the direction perpendicular to the terminal surfaces of the connection terminals 13. Thus, positional displacement due to vibration can be inhibited.

In the electronic device unit 10 according to the present disclosure, the distal end portion 17*a* of the resin portion 17 which is to be inserted into the end portion 33*a* of the insertion chamber 33 of the female connector 31 preferably has a smooth inclined cross-sectional shape taken along a plane perpendicular to the direction in which the connection terminals 13 are aligned.

According to this configuration, even when the relative positions of the electronic device unit 10 and the female connector 31 are displaced, due to a clearance for fitting, in the direction perpendicular to the terminal surfaces of the connection terminals 13, the distal end portion 17*a* of the resin portion 17 can be smoothly inserted into the end portion 33*a* of the insertion chamber 33 of the female connector 31 in a sliding manner, whereby the positional displacement of the electronic device unit 10 and the female connector 31 can be corrected.

In the electronic device unit 10 according to the present disclosure, the cutout region 12*b* is provided at and around the center of the board end portion 12*a*, and the resin portion 17 having a wall-like projection shape is provided at a side surface portion of the board end portion 12*a* that is in contact with the cutout region 12*b*, and the side surface 17*b* of the resin portion 17 is press-fitted into the end portion 33*b* of the insertion chamber 33 at the center portion of the female connector 31.

According to this configuration, since the resin portions 17 having wall-like projection shapes are provided around the center of the board end portion 12*a* in addition to the side surface of the board end portion 12*a* in the direction in which the connection terminals 13 are laterally aligned, the relative positions of the connection terminals 13 and the terminals 32 can be more firmly fixed in the direction in which the connection terminals 13 are laterally aligned, so that positional displacement due to vibration and dimensional change caused by temperature change can be further inhibited.

In the electronic device unit 10 according to the present disclosure, the upper surface 17*c* and the lower surface 17*d* of the resin portion 17 provided around the center of the board end portion 12*a* is preferably press-fitted into the end portion 33*b* of the insertion chamber 33 at the center portion of the female connector 31.

According to this configuration, also around the center of the board end portion 12*a*, the relative positions of the connection terminals 13 and the terminals 32 can be fixed in the direction perpendicular to the terminal surfaces of the connection terminals 13, so that positional displacement due to vibration can be further inhibited.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

10 electronic device unit
11 electronic component
12 circuit board
12*a* board end portion
12*b* cutout region
13 connection terminal
15 sealing resin
16 sealing resin portion
17 resin portion
17*a* distal end portion of resin portion
17*b* side surface of resin portion
17*c* upper surface of resin portion
17*d* lower surface of resin portion
19 board end resin portion
31 female connector
32 terminal
32*a* contact point
33 insertion chamber
33*a* end portion of insertion chamber
33*b* end portion of insertion chamber

What is claimed is:

1. An electronic device unit comprising:

a circuit board having a sealing resin portion in which a region, in which an electronic component is mounted, is sealed by a sealing resin, and a board end portion exposed from one side of the sealing resin portion; and a plurality of connection terminals provided on the board end portion and aligned in a direction of the one side of the sealing resin portion, the plurality of connection terminals being connected to terminals of a connector when the board end portion is inserted into the connector, wherein a resin portion thicker than the board end portion is provided at at least one of side surfaces of the board end portion in the direction in which the plurality of connection terminals are aligned, and a side surface of the resin portion is press-fitted into an insertion chamber of the connector.

2. The electronic device unit according to claim 1, wherein the sealing resin portion and the resin portion provided at the side surface of the board end portion are integrally molded by the sealing resin.

3. The electronic device unit according to claim 1, wherein a distal end of the resin portion which is to be inserted into the connector has an inclined cross-sectional shape along a plane parallel to a surface of the circuit board.

4. The electronic device unit according to claim 1, wherein a board end resin portion formed from the same material as the resin portion at the side surface of the board end portion is provided at a distal end portion of the board end portion of the circuit board which is to be inserted into the connector, and has an inclined cross-sectional shape along a plane perpendicular to the direction in which the plurality of connection terminals provided on the board end portion are aligned.

5. The electronic device unit according to claim 1, wherein an upper surface and a lower surface of the resin portion are press-fitted into the insertion chamber of the connector.

6. The electronic device unit according to claim 5, wherein a distal end of the resin portion which is to be inserted into the connector has an inclined cross-sectional shape along a plane perpendicular to the direction in which the plurality of connection terminals provided on the board end portion are aligned.

7. The electronic device unit according to claim 1, wherein a cutout region is provided at a center portion of the board end portion, a second resin portion thicker than the board end portion is provided at a side surface portion of the board end portion which is in contact with the cutout region, and a side surface of the second resin portion is press-fitted into the insertion chamber of the connector.

8. The electronic device unit according to claim 7, wherein an upper surface and a lower surface of the second resin portion are press-fitted into the insertion chamber of the connector.

* * * * *